United States Patent [19]
Slocum et al.

[11] Patent Number: 5,971,156
[45] Date of Patent: Oct. 26, 1999

[54] SEMICONDUCTOR CHIP TRAY WITH ROLLING CONTACT RETENTION MECHANISM

[75] Inventors: Alexander H. Slocum, Bow, N.H.; David J. Gessel, Oakland, Calif.

[73] Assignee: Kinetrix, Inc., Bedford, N.H.

[21] Appl. No.: 08/924,354

[22] Filed: Sep. 5, 1997

[51] Int. Cl.[6] .................................................. B65D 85/00
[52] U.S. Cl. ............................ 206/724; 206/726; 206/560
[58] Field of Search .................................... 206/560, 724, 206/726, 728, 480, 483, 331, 329; 439/330, 331, 526

[56] References Cited

U.S. PATENT DOCUMENTS

| | | | |
|---|---|---|---|
| 3,892,312 | 7/1975 | Tems | 206/328 |
| 4,073,381 | 2/1978 | Patterson | 206/333 |
| 4,379,505 | 4/1983 | Alemanni | 206/329 |
| 4,444,309 | 4/1984 | Morton, Jr. | 206/329 |
| 4,535,887 | 8/1985 | Egawa | 206/724 |
| 4,547,794 | 10/1985 | Tang | 206/724 |
| 4,549,651 | 10/1985 | Alemanni | 206/329 |
| 4,591,053 | 5/1986 | Alemanni | 206/331 |
| 4,681,221 | 7/1987 | Chickanosky et al. | 206/328 |
| 4,718,548 | 1/1988 | Estrada et al. | 206/329 |
| 4,747,483 | 5/1988 | Grabbe | 206/309 |
| 4,767,984 | 8/1988 | Bakker | 206/724 |
| 4,991,714 | 2/1991 | Clatanoff | 206/331 |
| 5,066,245 | 11/1991 | Walker | 439/526 |
| 5,080,228 | 1/1992 | Matson, III et al. | 206/331 |
| 5,131,535 | 7/1992 | O'Connor et al. | 206/329 |
| 5,160,270 | 11/1992 | Reymond | 439/330 |
| 5,203,452 | 4/1993 | Small et al. | 206/329 |
| 5,291,994 | 3/1994 | Murphy | 206/331 |
| 5,375,710 | 12/1994 | Hayakawa et al. | 206/331 |
| 5,400,904 | 3/1995 | Matson, III et al. | 206/329 |
| 5,418,692 | 5/1995 | Nemoto | 361/809 |
| 5,423,422 | 6/1995 | Boire et al. | 206/334 |
| 5,526,936 | 6/1996 | Matsuzoe | 206/724 |
| 5,584,717 | 12/1996 | Radde et al. | 206/724 |

FOREIGN PATENT DOCUMENTS

WO 93/20678  10/1993  WIPO .

*Primary Examiner*—David T. Fidei
*Attorney, Agent, or Firm*—Edmund J. Walsh

[57] ABSTRACT

A transport tray for semiconductor devices that includes a retention mechanism. The tray is formed with molded plastic inserts positioned in a tray. Each insert includes a contact surface that is designed to have two stable points, one corresponding to a latched state and one corresponding to an unlatched state. The retention mechanism includes elements that allow the contact surface to rotate and translate relative to the surface of a semiconductor component being inserted or removed from the tray. Rotation across the surface, as opposed to sliding, significantly reduces the wear of the retention mechanism.

16 Claims, 6 Drawing Sheets

SEMICONDUCTOR CHIP TRAY WITH ROLLING CONTACT RETENTION MECHANISM

This invention relates generally to processing of semiconductor components and more particularly to trays that are used for holding a plurality of semiconductor chips during manufacture or testing.

Semiconductor devices go through many processing steps during their manufacture. Many of the early processing steps occur while the devices are being fabricated on a wafer. Many devices are made on a wafer so that by handling a wafer, multiple devices are handled efficiently. However, at some stage in the processing, the wafer is cut into individual dies, with each die containing the circuitry for one semiconductor device. The dies are each encapsulated in a package.

Traditionally, the packaged semiconductor chips have been inserted into tubes so that an entire tube full of devices could be handled at one time. Tubes were particularly well suited for gravity feed type handling devices. The tubes were simply tilted and the devices would slide out of the tube one at a time. However, tube type handling systems are most effective with parts that have enough mass and a lead arrangement that allows the packaged devices to slide easily.

More recently, semiconductor chips have gotten relatively smaller and have numerous leads that would prevent them from sliding easily. Thus, many modem semiconductor chips are transported in trays. The trays have numerous compartments such that numerous semiconductor devices can be handled at one time. One example of such a tray is described in U.S. patent application 08/653,588, now U.S. Pat. No. 5,758,776 to Slocum et al., which is hereby incorporated by reference.

As the trays are moved around, the chips in the trays are subject to various accelerations in various directions. The forces might cause the chips to fall out of the trays or to move about in the trays into positions in which they can not be effectively processed. Either event could disrupt the processing of the semiconductor devices. Disruptions in processing are very undesirable because semiconductor processing operations are generally highly automated so that many parts can be processed quickly. Disruptions generally require manual intervention that is costly and delays processing.

Some semiconductor chip carriers have employed retention mechanisms to prevent the chips from bouncing out of the carriers. U.S. Pat. No. 5,375,710 by Hayakawa et al. describes a carrier for a single chip that has a latch mechanism. The latch mechanism is formed with a flexural beam with a tip that has a positive and negative slope. As the semiconductor device is pressed into the carrier, it presses against the positive sloped portion. As the chip slides down the positively sloped portion, it forces the beam back until the negatively sloped portion is reached. Then, the beam bends back to latch the chip into the carrier.

U.S. Pat. No. 5,080,228 to Maston et al. Shows a chip carrier with a retention system that requires actuation, such as with a thumb and forefinger or a squeeze type gripper. However, the requirement for a secondary actuation force reduces the speed at which the device can operate or increases the complexity of the equipment needed to use the device.

U.S. Pat. No. 5,066,245 to Walker describes a semiconductor chip socket that includes a retention mechanism. The retention mechanism likewise has positive and negative sloped portions along which the chip slides. In this patent, the spring force on the retention mechanism is provided by bending and twisting a beam.

U.S. Pat. No. 4,444,309 to Morton is yet another example of a chip carrier with a flexural arm for retaining the chip. The arm is bent back to allow a chip to be inserted in the carrier. When released, the arm applies a spring force that holds a chip in place.

However, these retention mechanisms for chip sockets or carriers are not well suited for use in semiconductor processing trays. One reason why they are not suitable is because a chip tray is designed to be used multiple times. During processing of one batch of parts, chips are often removed from the tray from processing and then returned to the same or a different tray. For example, once one tray of parts is tested, the parts in the tray are sorted by performance level by moving the parts into different trays. Once one batch of semiconductor parts in a tray is finished processing, the parts are removed from the tray and packaged for shipment to customers. The tray is then reused for the next batch of parts.

Each tray is likely to have chips inserted and removed from it multiple times over its life. The chip packages are made from silicates bonded by a resin. The silicates make the exterior surfaces of the chip packages very abrasive. Thus, each time a chip is inserted or removed from the tray, the retention mechanism is abraded. Over multiple insertions and removals, retention mechanisms that depend on the chip sliding across a surface of the carrier wear to the point that they cease to firmly hold the chip. While this condition might not arise in a chip carrier because of the limited number of times a chip is inserted or removed from such items, it would be a significant problem for a chip tray used in a processing operation.

A second problem with the above described designs is that they have a high removal force. Semiconductor devices are often loaded into and unloaded from trays using one or more pick and place mechanisms. The pick and place mechanism is generally a vacuum port on the end of a moveable arm. To pick the part up, the vacuum port is brought into contact with the chip and than a vacuum is drawn. To put the chip down, the vacuum is released.

The vacuum is strong enough to hold the semiconductor device as the arm is moved. However, the vacuum is not strong enough to overcome significant retention force. While a high retention force is desirable for a socket, it is undesirable for a chip tray. Therefore, prior designs for chip sockets and chip carriers are not suitable for direct application to a chip tray because they do not allow the chips to be easily taken from the tray.

Thus, there is a need for a retention mechanism for a semiconductor chip tray that does not suffer from high abrasion. There is also a need for a retention mechanism that provides adequate retention force but allows the chip to be removed from tray with a vacuum pick and place.

In addition, the retention mechanism must be small and operate without complicated mechanical apparatus. Most chip trays are molded from plastic to reduce cost and it would be undesirable to require numerous additional components that increased complexity and therefore cost of the tray. Moreover, the tray design should not increase the complexity of the equipment that processes the chips carried in the tray. For example, it is undesirable for the tray to require secondary forces to insert or remove the chips from the tray. If secondary forces are required, each processing station would need to be modified to include a mechanical apparatus to generate that secondary force. Because a tray is used in several processing operations, modifications would be needed to several processing stations, thereby introducing undesirable complexity in the process.

SUMMARY OF THE INVENTION

With the foregoing background in mind, it is an object of the invention to provide a tray for carrying integrated circuit chips with a retention mechanism.

It is also an object to provide a chip tray with a retention mechanism that is not prone to wear.

It is also an object to provide a chip tray with a retention mechanism that allows easy insertion or extraction of a chip.

The foregoing and other objects are achieved in a chip tray having a retention feature with flexural motion that allows a face portion to rotate as a chip is inserted. The retention mechanism is shaped to be bi-stable, corresponding to locked or open positions.

In a preferred embodiment, the retention mechanism has a face portion attached to the body of the tray through a flexural element.

In other embodiments the retention mechanism is molded from plastic as a feature in the tray.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
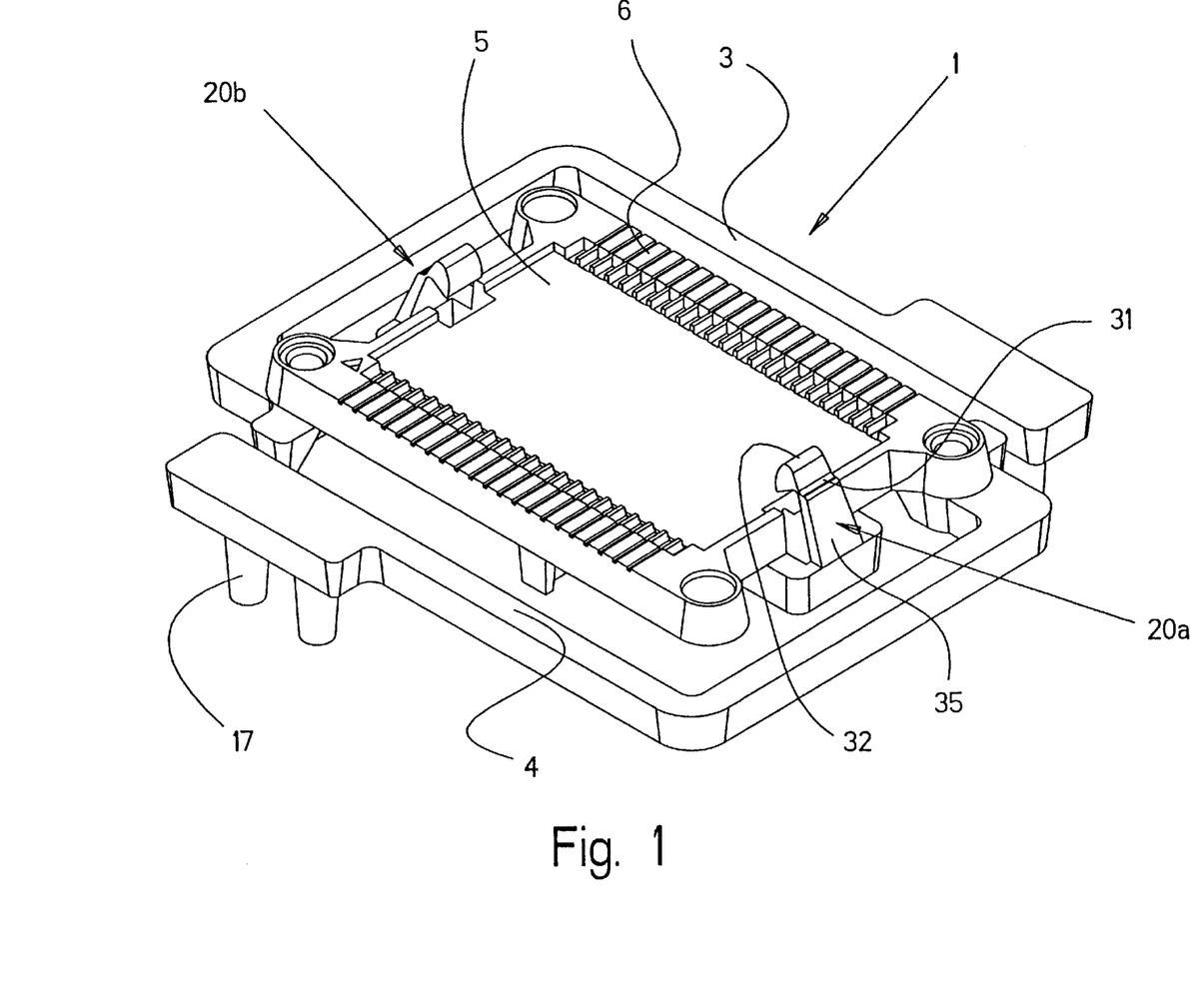
FIG. 1 shows a tray insert incorporating the invention.
Figure 2:
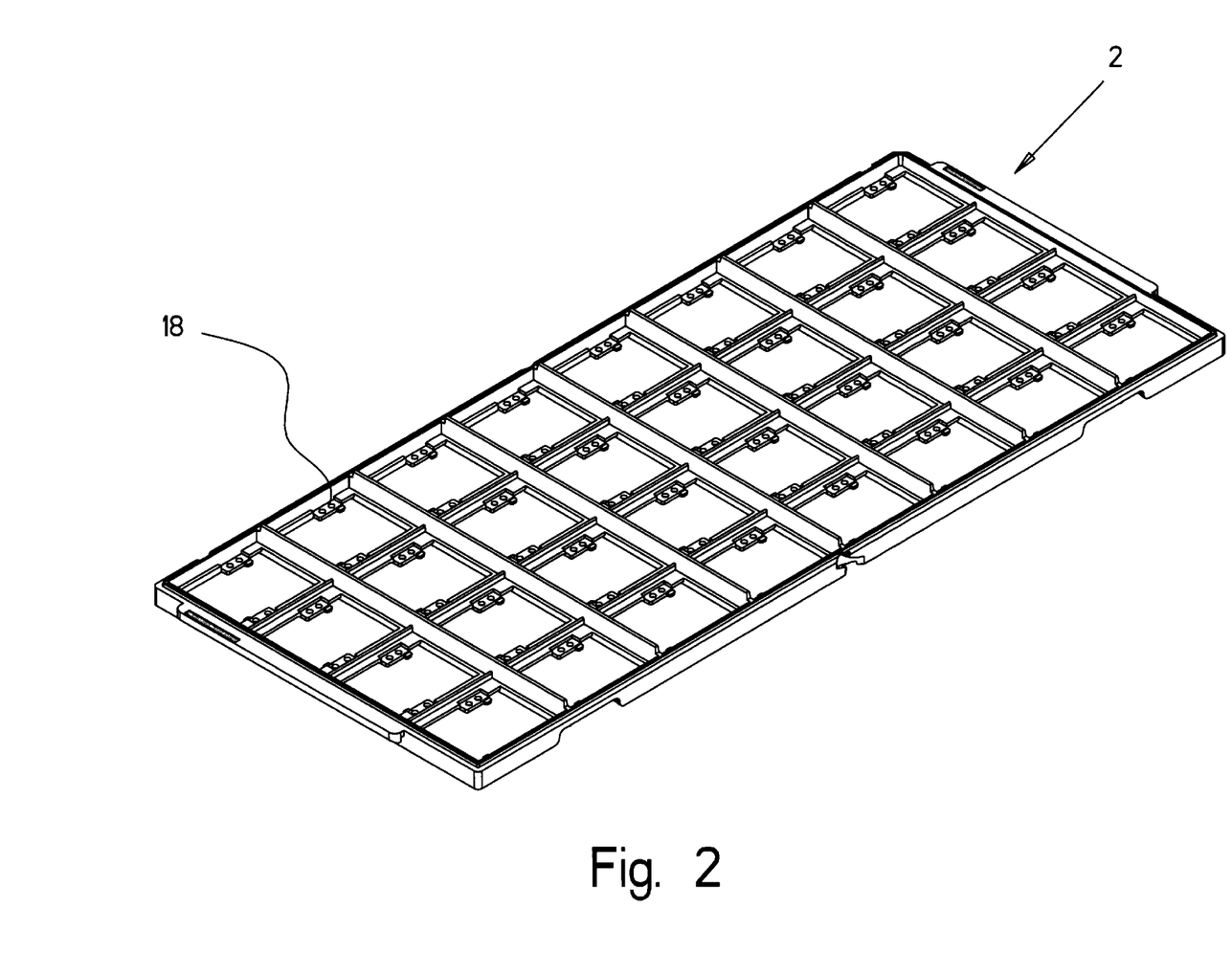
FIG. 2 shows a tray frame into which the insert of FIG. 1 might be inserted.

FIG. 1 shows an insert 1 that is used to form a semiconductor chip transport tray according to the invention. The insert 1 fits into a tray frame 2 (FIG. 2). Pegs 17 fit into alignment holes 18 (FIG. 2) in tray frame 2 (FIG. 2). In a preferred embodiment, a tray according to the invention can carry multiple semiconductor chips at the same time. Therefore tray frame 2 has several rows and columns of locations into which insert 1 might be installed. Multiple inserts would be used to make a complete tray. However, for simplicity, a single insert 1 is described herein.

Insert 1 and tray frame 2 are preferably molded from plastic. Having insert 1 separate from tray frame 2 allows the same tray frame to be used for many types of semiconductor devices.

Insert 1 contains a center portion 5 on which a semiconductor device (element 10, FIG. 3) will rest. Numerous component lead nesting features 6 are included in insert 1 to receive leads (element 7, FIG. 3) from the semiconductor device. The size and shape of center portion 5 and lead nesting features 6 will depend on the size and shape of the semiconductor device to be transported in the chip transport tray according to the invention.

Center portion 5 is suspended on flex arms 3 and 4. Flex arms 3 and 4 allow center portion 5, and therefore a semiconductor device on it, to move with six degrees of freedom. As described in the above mentioned patent application, 08/653,588 to Slocum et al., flex arms 3 and 4 enable the semiconductor devices in the transport tray to be inserted into a work station, such as a test station, without being removed from the tray. The flex arms 3 and 4 allow the semiconductor devices to be aligned with the work station, despite inaccuracies in the manufacture of the tray or the work station or inaccurate positioning of the semiconductor devices in the tray.

Insert 1 is formed with retention devices 20a and 20b on it. Preferably, each retention device will have the same general construction and will be disposed symmetrically with respect to the integrated circuit chip to be placed on center portion 5. For simplicity, only retention device 20a is described.

Retention device 20a is, as is the rest of insert 1, molded from plastic. It contains a beam 35 that is generally perpendicular to center portion 5. It also contains a head 32 that is joined to beam 35 at a neck region 31.

The length and thicknesses of the structures of insert 1 are preferably selected based on the type of device to be transported in the tray. By way of example, beam 35 has a thickness between about 1 mm and 5 mm. In contrast, neck region 31 should be thinner, with a thickness less than about 1 mm. Beam 35 should have a length sufficient to extend between 1 and 10 mm above the surface of a chip carried by insert 1 and have a width between about 5 mm and 25 mm. Beam 35 should also be angled to project head region 32 above center region 5, where a chip will rest when inserted.

Figure 3:
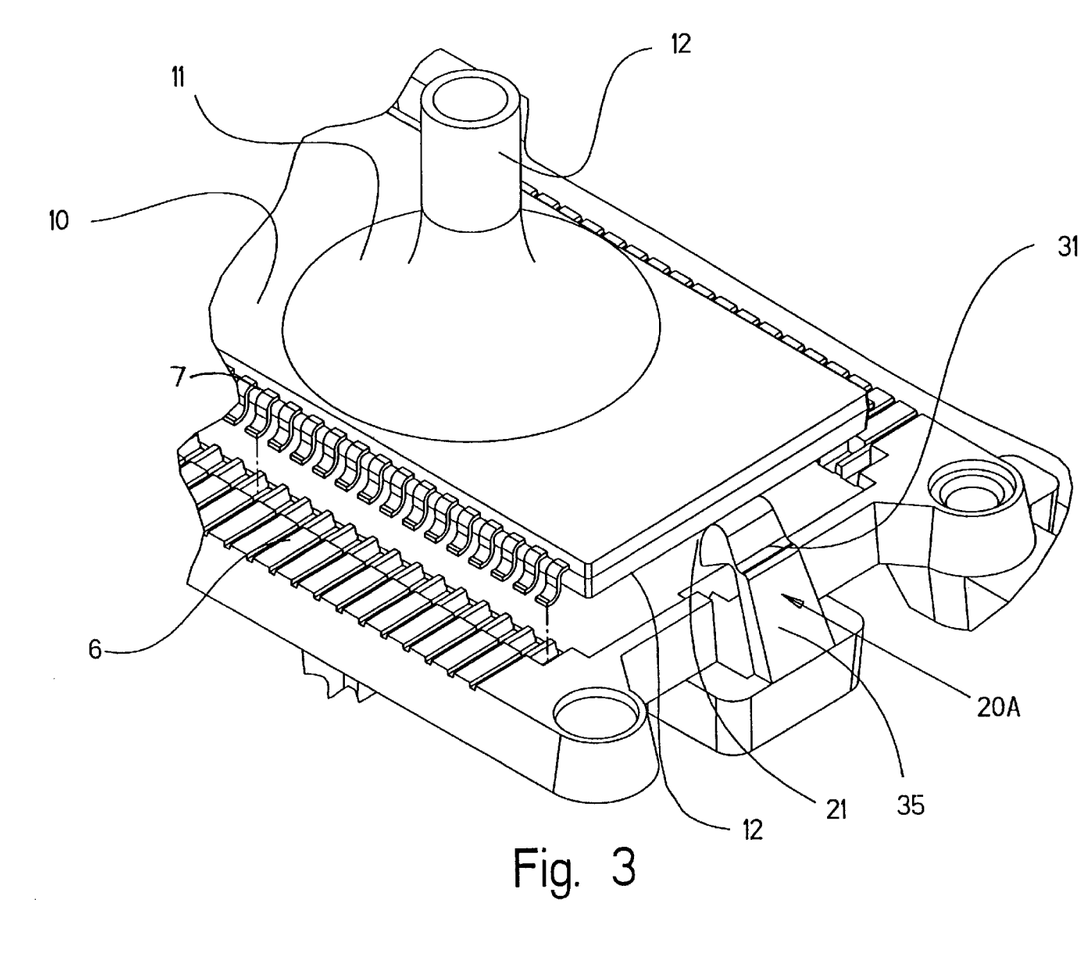
FIG. 3 shows an integrated circuit chip, partially cut away, at a first stage of insertion into a tray, partially cut away, incorporating the invention.

Turning now to FIG. 3, retention device 20a is shown in operation. A semiconductor component 10 is held by a pick and place mechanism that includes a cup 11 and post 12. Post 12 is hollow so that a vacuum can be drawn through it creating sufficient force to hold semiconductor component 10 on cup 11. Vacuum lines are typically available in a semiconductor handling operation as part of a semiconductor handling device that would include a tray loader or unloader of the type pictured in FIG. 3. Vacuum lines are typically able to generate a holding force in the range of a few ounces, typically less than about 10 ounces.

Using traditional positioning technology, post 12 is moved until semiconductor component 10 is aligned with insert 1 (FIG. 1). Leads 7 align with component lead nesting features 6. Post 12 then moves down, i.e. perpendicular to center portion 5 and generally parallel to beam 35. FIG. 3 shows that post 12 has moved down to the point where bottom edge 12 of semiconductor component 10 engages lower face region 21 of head 32.

Figure 4:
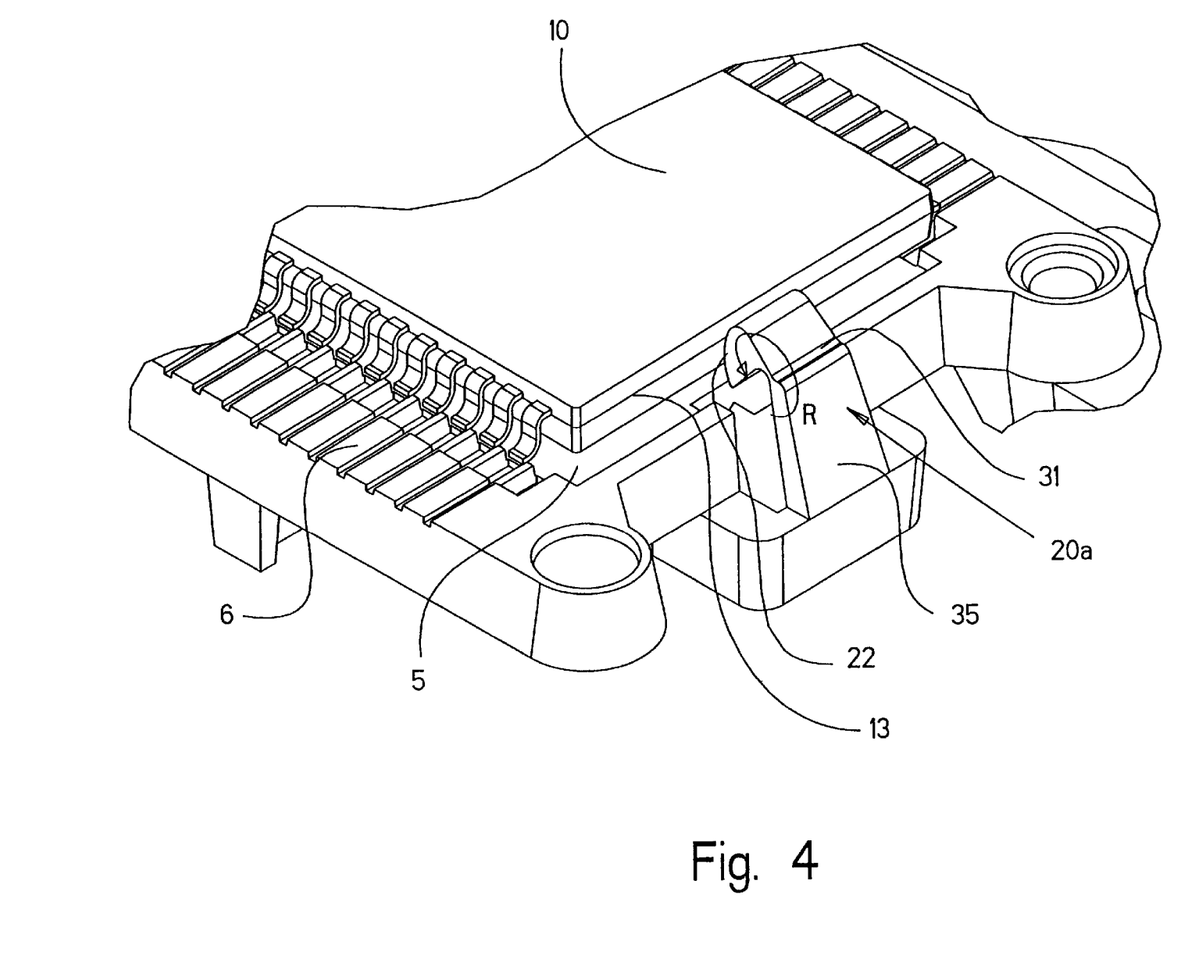
FIG. 4 shows an integrated circuit chip, partailly cut away, at a second stage of insertion into a tray, partially cut away, incorporating the invention.

Turning to FIG. 4, a point later in the loading process is shown. FIG. 4 shows that semiconductor component 10 is inserted to the point that it is approximately halfway through the process of engaging retention mechanism 20a. Semiconductor component 10 has been pressed further down into insert 1. In FIG. 4, side edge 13 of semiconductor component 10 makes contact with middle face region 22 of head 32. To reach this position, head 32 has rotated in the direction R about an axis parallel to neck region 31. Thus, the face of head 32 rotates across the surface of semiconductor device 10 during the loading operation. This rotational motion significantly reduces the amount that semiconductor component 10 slides across any surface of retention device 20a.

If necessary, beam 35 will flex to move head 32 towards or away from semiconductor component 10 to provide the required compliance. This flexural motion urges the face regions of head 32 into contact with edges of semiconductor component 10 despite any differences in the distance between neck region 31 and lower face region 21 or middle face region 22. Flexural motion of beam 35 also compensates for any motion of component 10 or any projections from semiconductor component 10 that would change the spacing between semiconductor component 10 and beam 35 as semiconductor component 10 is lowered into the insert 1.

Figure 5:
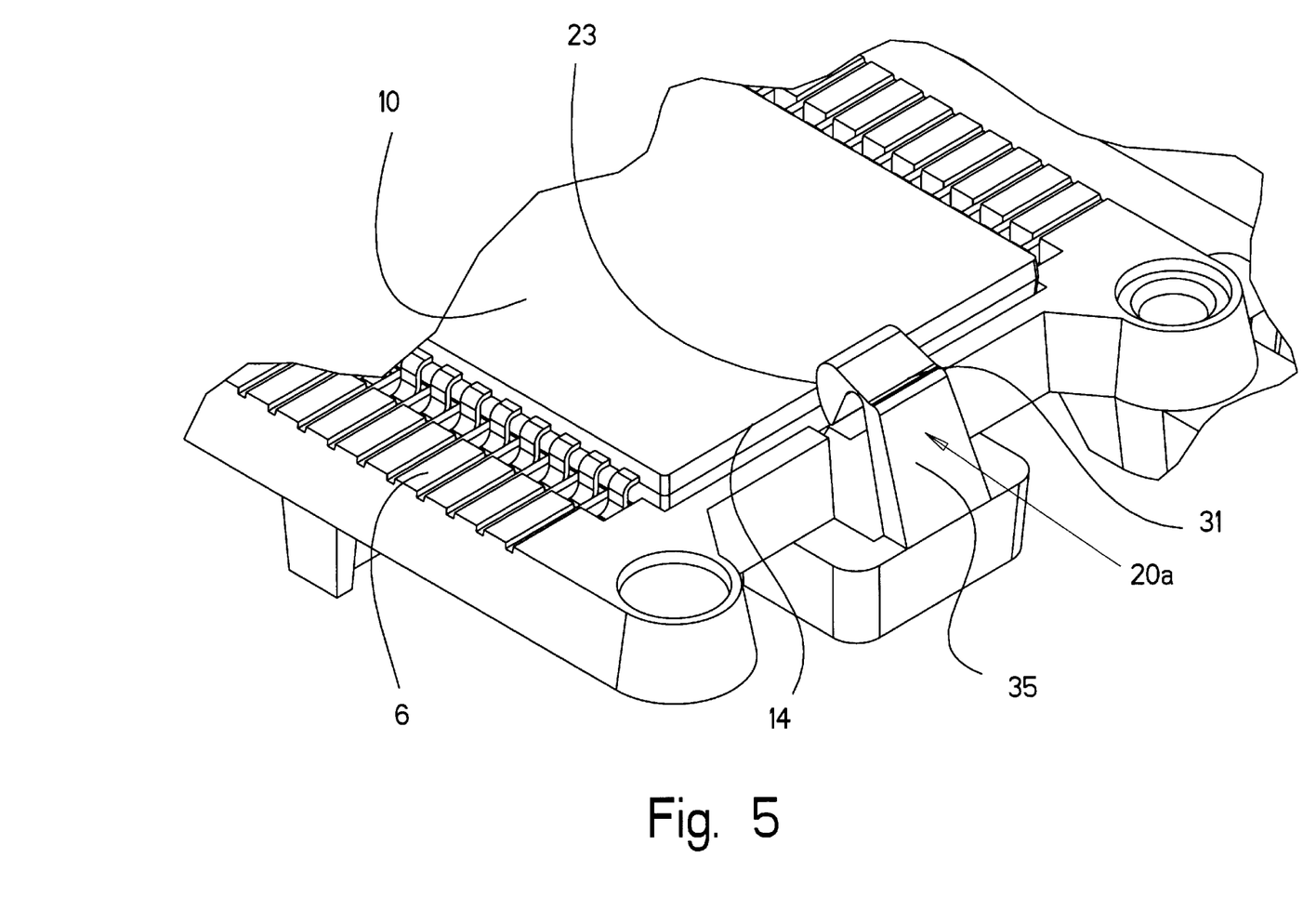
FIG. 5 shows an integrated circuit chip, partially cut away, fully inserted into a tray, partially cut away, incorporating the invention.

Turning now to FIG. 5, semiconductor component 10 is shown pushed down to the bottom of its travel. Retention mechanism 20a is engaged in this position. Head 32 has rotated further about neck region 31 to bring top face region 23 in contact with top edge 14 of semiconductor device 10.

Head 32 is shaped such that the position shown in FIG. 5 is a stable position. Specifically, head 32 is prevented from reverting to the position of FIG. 1 because side edge 13 of component 10 prevents head 32 from rotating back. Head 32 can rotate back to the open position if component 10 is lifted back to the position shown in FIG. 3. However, upward motion of component 10 is restrained because top face region 23 is imparting a force with a downward component onto top edge 14 of component 10.

The force exerted on top edge 14 is sufficient to hold component 10 in insert 1 during most handling operations. However, if sufficient force is placed on component 10 in an upward direction, beam 35 will flex enough to allow component 10 to be lifted out of insert 1. As component 10 is lifted out, the face region of head 32 will again roll along side edge 13 of component 10. Such a force might be applied by a pick and place mechanism. Therefore, a robot equipped with a standard vacuum cup gripper could insert or remove components from a tray without requiring time delaying auxiliary probes to spread a retention device.

The exact size and shape of head 32, neck region 31 and beam 35 can be optimized based on the size and shape of the component to be held, the amount of force that is available to insert and remove a component from the tray and the amount of acceleration force a component might experience during handling. Also, the amount of space available might constrain the design in some instances.

Having described one embodiment, numerous alternative embodiments or variations might be made. For example, it was described that a semiconductor chip transport tray was formed by installing a plurality of inserts into a plastic tray frame. Alternatively, the entire tray could be molded at one time. Also, it is not critical to the invention that the tray frame be plastic. It might for example be metal or other suitable material. Forming a frame of metal has the added advantage of being able to be manufactured with tighter tolerances than plastic molding. Keeping tight tolerances in a plastic molding operation is difficult, particularly for large parts. The inserts are small enough that they can be molded with adequate tolerance. Using the metal tray frame to position the inserts thus provides good tolerances while still allowing much of the tray to be manufactured using a low cost plastic molding operation.

Also, it was described that two retention devices are used on each insert. Preferably, at least two retention devices are used per insert. For larger chips, or chips in which leads extend from all four sides of the chip, four retention devices might be used per chip, one at each corner of the chip. Conversely, one edge of a chip might be inserted under a shelf or other fastening device with a single retention device according to the invention used at an opposing edge of the chip.

One important aspect of the described embodiment is that the face of the retention device rolls rather than slides across the face of the semiconductor component to implement what might be described as a simplified form of an involute contact. In addition to the illustrated convex shape, there are instances where a flat or concave contact surface might be used.

Figure 6:
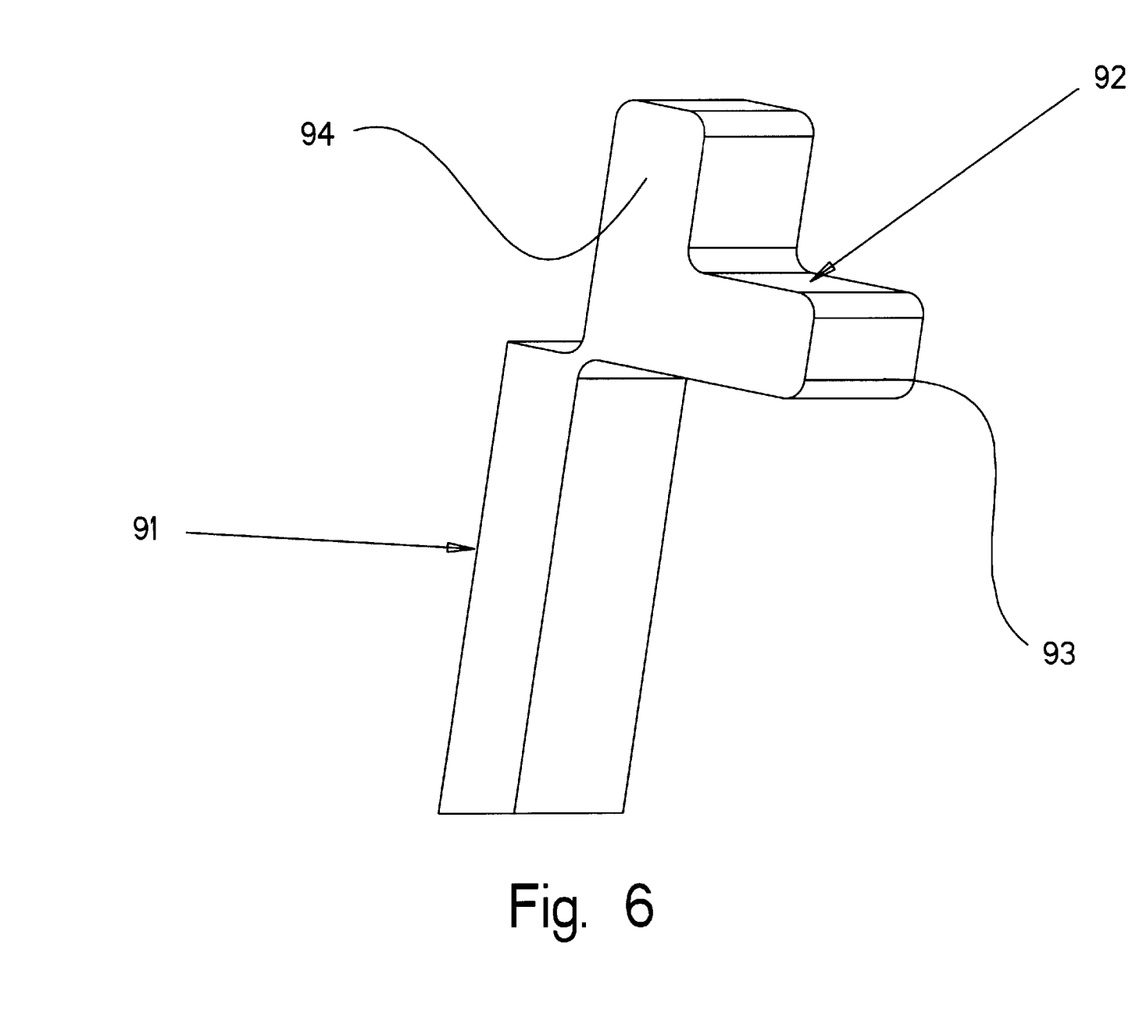
FIG. 6 shows an alternative embodiment of a retention device, shown cut away from a tray, with a concave contact surface.

FIG. 6 shows an alternative embodiment of a retention device 91, shown cut away from an insert 1. Retention device 91 has a concave contact region 92. Concave contact region 92 has an arm 93, which, during an insertion operation, is initially horizontal. The actuation sequence, as illustrated in FIGS. 3–5 would still exist with substantially rolling motion between the chip and contact region 92. After the chip is inserted and locked in the tray, arm 93 points downward and arm 94 is horizontal.

It is known to those of skill in the art of gear and mechanism design how to optimize the dimensions of the flexural bearings and the shape of the contact surface.

Therefore, the invention should be limited only by the spirit and scope of the appended claims.

What is claimed is:

1. A tray for transporting semiconductor components, comprising:
   a) a plurality of sites, each having a central portion adapted to receive a semiconductor component; and
   b) a plurality of retention devices, with at least one retention device adjacent to each of the sites, for retaining a semiconductor component in the central portion of each site, the retention device comprising
      i) a head region,
      ii) a base region, attached to the site and having a distal end extending above the central portion, and
      iii) a rotational bearing joining the head region to the distal end of the base region.

2. The tray of claim 1 wherein the base region comprises a flexible beam.

3. The tray of claim 1 wherein the head region has at least one curved face.

4. The tray of claim 3 wherein there are at least two retention devices adjacent each site with the curved faces of each head region mounted facing each other.

5. The tray of claim 1 wherein there are at least two retention devices, each having a head with a contact surface and the contact surfaces being mounted facing each other.

6. The tray of claim 5 wherein the contact surface of each retention device is flat.

7. The tray of claim 5 wherein the contact surface of each retention device is convex.

8. The tray of claim 5 wherein the contact surface of each retention device is concave.

9. The tray of claim 5 wherein the contact surface of each retention device has a head region comprising a first arm and a second arm perpendicular to the first arm.

10. The tray of claim 1 wherein each site and an adjacent retention device are integrally molded of plastic.

11. The tray of claim 1 wherein the head of each retention device has a thickness and the base of each retention device has a thickness and the rotational bearing comprises a neck region having a thickness that is less than the thickness of the head and the base.

12. The tray for transporting semiconductor devices of claim 1 wherein the each site and the retention mechanism attached thereto is molded of plastic and the tray further comprises a frame having a plurality of openings with a site inserted therein.

13. A tray for holding semiconductor devices, the tray having a plurality of sites each adapted to receive a semiconductor component, and each site having mounted adjacent thereto a retention device, the retention device comprising:

a) a contact surface; and b) means for supporting the contact surface and allowing it to engage and rotate across the side of a semiconductor component as it is inserted into the site and for holding the contact surface in a stable position when the semiconductor component is fully inserted into the site.

14. The tray of claim 13 wherein the means for supporting comprises means for allowing the contact surface to rotate and means for allowing the contact surface to be compliant with the semiconductor component as it is inserted into the site.

15. The tray of claim 14 wherein the means for supporting is made of plastic.

16. The tray of claim 13 comprising a plurality of sites, each site having a plurality of retention devices, the plurality of retention devices mounted in pairs with the contact surfaces of the retention devices in each pair facing each other.

* * * * *